United States Patent
Walukas

(10) Patent No.: US 6,229,737 B1
(45) Date of Patent: *May 8, 2001

(54) METHOD AND APPARATUS FOR INITIALIZING SEMICONDUCTOR MEMORY

(75) Inventor: Joel James Walukas, Cary, NC (US)

(73) Assignee: Ericsson Inc., Research Triangle Park, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/766,181

(22) Filed: Dec. 12, 1996

(51) Int. Cl.$^7$ ........................................... G06F 3/08
(52) U.S. Cl. ................................. 365/185.33; 365/185.11; 365/230.03; 365/189.05; 365/189.07; 711/103; 711/118; 711/126
(58) Field of Search ........................ 235/492; 365/230.03, 365/185.11, 218, 185.29, 185.33; 711/103; 371/21.4

(56) References Cited

U.S. PATENT DOCUMENTS

| | | |
|---|---|---|
| 4,578,751 | 3/1986 | Erwin . |
| 5,053,990 | 10/1991 | Kreitels et al. . |
| 5,200,600 * | 4/1993 | Shinagawa ............................ 235/492 |
| 5,263,003 * | 11/1993 | Cowles et al. ................... 365/230.03 |
| 5,295,255 | 3/1994 | Malecek et al. . |
| 5,341,489 * | 8/1994 | Heiberger et al. ............... 365/185.11 |
| 5,396,468 * | 3/1995 | Harari et al. .......................... 365/218 |
| 5,488,711 * | 1/1996 | Hewitt et al. ......................... 711/103 |
| 5,530,828 | 6/1996 | Kaki et al. . |
| 5,548,741 | 8/1996 | Watanabe . |
| 5,564,032 | 10/1996 | Aota et al. . |
| 5,621,687 * | 4/1997 | Doller ............................. 365/185.29 |
| 5,621,738 * | 4/1997 | Caywood et al. .................. 371/21.4 |
| 5,640,349 * | 6/1997 | Kakinuma et al. ............. 365/185.33 |

OTHER PUBLICATIONS

Component spec. sheet of AT28HC256, 1995/96 ATMEL catalog, pp. 2–183 to 2–185.
Component spec. sheet of AT29C040A, 1995/96 ATMEL catalog, pp. 5–89 to 5–91.
Component spec. sheet of AM29F040, Advanced Micro Devices catalog, Mar. 1994, pp. 1–79 to 1–95.

\* cited by examiner

Primary Examiner—John W. Cabeca
Assistant Examiner—Fred F. Tzeng
(74) Attorney, Agent, or Firm—Burns, Doane, Swecker & Mathis, L.L.P.

(57) ABSTRACT

A method and apparatus interleaves flash memory programming with E$^2$ROM memory programming. In exemplary embodiments, the E$^2$ROM accepts data in units of pages, whereas the flash memory accepts data in units of pages or individual bytes. As such, a first exemplary technique interleaves page-write E$^2$ROM programming with page-write flash memory programming. A second exemplary technique interleaves page-write E$^2$ROM programming with byte-write flash memory programming. Portions of the E$^2$ROM programming are performed in parallel with portions of the flash memory programming, thereby expediting overall programming time (compared to performing E$^2$ROM and flash memory programming in serial fashion).

16 Claims, 5 Drawing Sheets

METHOD AND APPARATUS FOR INITIALIZING SEMICONDUCTOR MEMORY

BACKGROUND

The present invention relates generally to a method and apparatus for programming semiconductor memory devices, and more particularly, to a method and apparatus for interleaving the programming of $E^2ROM$ memory devices with flash memory devices so as to reduce overall programming time.

Cellular telephones commonly incorporate one or more types of nonvolatile memory devices. For instance, one known configuration employs a flash memory to store a processing program (i.e. the code) used by the cellular telephone, and an EEPROM for storing various configuration parameters and like information (i.e. the non-volatile data segment). U.S. Pat. No. 5,564,032 to Aota et al. exemplifies a cellular telephone which uses both a flash memory and an EEPROM. In the technique taught by Aota, the flash memory is programmed using program code stored in the EEPROM.

The EEPROM (hereinafter referred to as "$E^2ROM$" for brevity) and the flash memory are typically programmed with binary data at the factory. For the flash memory, this binary data may represent the executable code used by the cellular phone in performing its various ascribed functions. For the $E^2ROM$, this binary data may represent non-volatile variables (e.g. serial number). Alternatively, the $E^2ROM$ can simply be initialized to all zeros. The programming process is quite time consuming due to the programming requirements of flash memories and $E^2ROMs$, and thus creates a significant bottleneck which adds to the cost of manufacturing the cellular telephones.

Notably, programming of a typical flash memory entails a two stage process. In the first stage, a computer processor loads a byte or a page of data into the flash's internal buffer. At the completion of the data load, the flash memory enters a program stage where the flash memory writes the information from its internal data buffer into its flash memory array. The computer processor periodically polls the flash memory during the second stage of programming to determine if the flash is finished programming. Otherwise, the computer processor serves no active role in the second stage of programming. The second stage is typically much longer than the first stage. Thus, the computer processor essentially remains idle for a substantial amount of time during the program cycle. $E^2ROMs$ are programmed using a similar two-stage approach.

Some practitioners have suggested various ways to reduce the amount of idle time of the processor during programming. U.S. Pat. No. 5,488,711 to Hewitt et al., for example, discloses downloading a burst of data from a computer processor to a static random access memory (SRAM) cache in the memory device, where this information is grouped into a plurality of pages. The SRAM then sequentially feeds pages into rows of an internal EEPROM memory array until the SRAM is depleted. During this sequential feeding operation, the processor is free to perform other tasks.

U.S. Pat. No. 5,530,828 to Kaki et al. teaches another method for reducing idle time of the processor. In this technique, a processor receives requests for writing data to an associated disk pack comprising a plurality of flash memory devices serviced by a write buffer memory. The processor responds to a request by translating logic sector numbers in the request to physical sector numbers associated with areas of the flash memories into which data are to be written. More specifically, the sector numbers are determined such that the data is distributed among a plurality of flash memories. The specific allocation of data among the flash memories is registered in a write management table.

After forming the write management table, the processor downloads the data to the write buffer memory. Information is then transferred from the write buffer memory to respective flash memories. More specifically, a first data block is transmitted to a first respective chip, which then commences to program this data into its internal memory array. While that chip is programming, a second data block is transmitted to a second chip, which then commences programming this data into its memory array. In this manner, this technique overlaps the programming time of two or more flash memories.

While useful, the above described systems do not specifically address the unique problems confronted in programming flash memories and $E^2ROMS$ in the cellular telephone (or analogous) environment. For instance, the $E^2ROM$ and flash memory store two respective discrete sets of data files. The $E^2ROM$ stores the various user defined parameters while the flash memory stores the operating code used by the cellular phone. Unlike Kaki, therefore, the processor in this environment is not free to arbitrarily distribute data from a single binary file to a plurality of flash memories. Rather, each device is loaded with a unique and specific binary file. This constraint presents a number of challenges. For instance, the $E^2ROM$ may have a different (e.g. smaller) memory capacity than the flash memory device, and may accept information in different size blocks of data. For example, $E^2ROMs$ may most efficiently accept information in units of pages, whereas flash memory may accept information in units of bytes or pages. The above described documents do not disclose or suggest how to interleave two separate streams of data between two different types of semiconductor memory devices. Nor do the above-described documents disclose or suggest how such interleaving is performed when the memory devices vary in memory capacity and/or storage protocol.

Accordingly it is an exemplary objective of the present invention to provide a technique for initializing semiconductor memory devices which does not suffer from the above described drawbacks.

SUMMARY

These and other exemplary features are achieved through a method and apparatus for interleaving flash memory programming with $E^2ROM$ memory programming. In exemplary embodiments, the $E^2ROM$ accepts data in units of pages, whereas the flash memory accepts data in units of pages or individual bytes. Accordingly, a first exemplary technique interleaves page-write $E^2ROM$ programming with page-write flash memory programming. A second exemplary technique interleaves page-write $E^2ROM$ programming with byte-write flash memory programming. Portions of the $E^2ROM$ programming are performed in parallel with portions of the flash memory programming, thereby expediting overall programming time (compared to performing $E^2ROM$ and flash memory programming in serial fashion).

In the first exemplary technique, a processor writes a page of a first stream of data to the internal buffer of a flash memory device. While the flash memory device is busy transferring the data in its internal buffer to its memory array, the processor writes the first page of a second stream of data to the internal buffer of an $E^2ROM$ device. The flash memory and the E²ROM memory therefore perform their programming in parallel.

In the second exemplary technique, the processor writes a series of bytes from a first stream of data to the flash memory, which collectively form a "pseudo-page" of flash memory. After the pseudo-page of flash memory has been downloaded to flash memory, the processor writes a page from a second stream of data to the internal buffer of the E²ROM. The E²ROM then proceeds to transfer the information stored in its buffer to its memory array. While the E²ROM is busy programming its memory array, the processor then simultaneously downloads a next series of bytes from the first data stream, collectively forming a second pseudo-page. The programming of pseudo-pages is performed in parallel with the programming of the E²ROM.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION

In the following description, for purposes of explanation and not limitation, specific details are set forth in order to provide a thorough understanding of the invention. However it will be apparent to one skilled in the art that the present invention may be practiced in other embodiments that depart from these specific details. In other instances, detailed descriptions of well-known methods, devices, and circuits are omitted so as not to obscure the description of the present invention with unnecessary detail.

Figure 1:
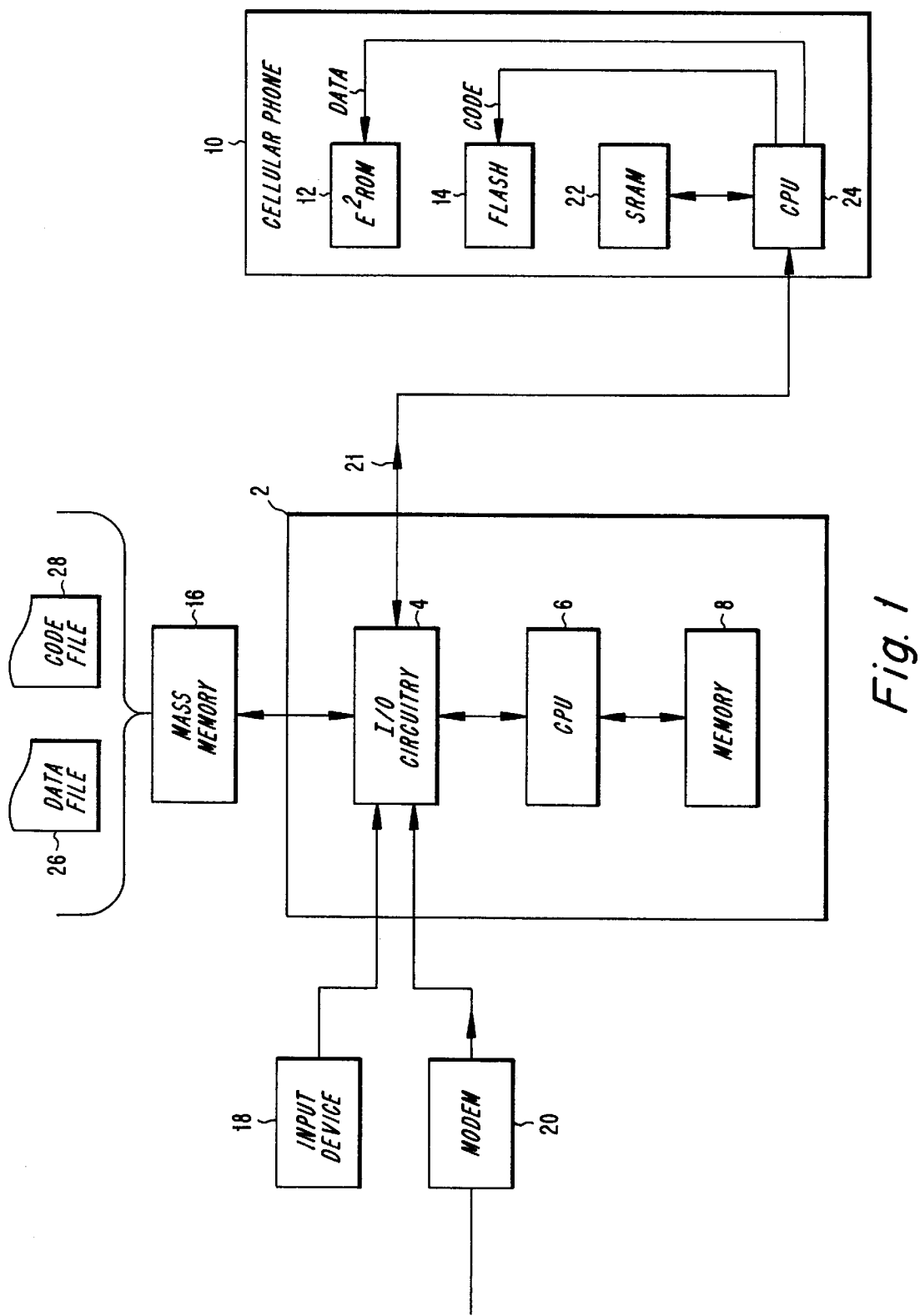
FIG. 1 shows an overview of an exemplary system for initializing semiconductor memories according to the present invention.

FIG. 1 illustrates an exemplary system for programming a cellular phone 10. The cellular phone 10 comprises an E²ROM memory 12 (such as E²ROM memory AT28HC256 produced by ATMEL) for storing various parameters and user-defined information, and a flash memory 14 (such as flash memory AM29F040 produced by Advanced Micro Devices) for storing code used by the cellular phone in performing its various ascribed functions. The cellular phone additionally comprises a CPU 24 (henceforth referred to as the "processor") and a static RAM 22 (e.g. SRAM). Although one cellular phone 10 is shown for simplicity, a plurality of cellular phones can be simultaneously programmed.

The SRAM 22 of the telephone 10 stores the binary program code used by the cellular phone in programming the E²ROM memory 12 and flash memory 14. This binary file is henceforth referred to as the "interleaving program". The interleaving program also implements a serial communications protocol which provides status information to the programmer station 2, responds to commands from the programming station 2, and also requests and accepts data packets from the programming station 2.

The programming station 2 itself comprises a CPU 6 in communication with I/O circuitry 4 and internal memory 8. The I/O circuitry 4, in turn, interfaces with an input device 18 (such as a keyboard or mouse), modem 20, mass memory device 16, and the CPU 24 of the cellular phone 10 via link 21. The mass memory 16 stores a file 26 containing binary data for downloading to the E²ROM memory 12, and a file 28 containing binary data for downloading to the flash memory 14.

The programming station executes a program (henceforth referred to as the "loading program") which complements the interleaving program. The loading program monitors status messages from the telephone 10, and issues commands to the telephone 10. The loading program also responds to requests from the telephone 10 for data packets. In performing this function, the loading program parses the binary files 26 and 28 into packets sized to match the sizes expected by the interleaving program. The size of the packets can be adjusted for different applications. In one embodiment, the maximum size is set by the available SRAM allocated for temporary buffer storage of information from data file 26 and the code file 28.

In operation, the memories 12, 14 and 22 initially contain no information. Thus, the programmer station 2 begins by downloading the interleaving program to the telephone's SRAM 22. The telephone 10 sends an acknowledgement to the programmer station 2 when the download process is successful via the serial data link 21. Thereafter, the telephone 10 executes the interleaving program stored in its SRAM 22.

The interleaving program begins by requesting a packet of data from the programmer station 2. This request specifies whether the data should be extracted from the E²ROM data file 26 or the flash code file 28. In response to receiving the request, the programmer station 2 parses the appropriate binary file (26 or 28) and transmits the requested data to the telephone 10. The telephone then stores this data in a temporary buffer set up in the SRAM 22. The telephone 10 can then request additional data packets from the programmer station 2.

Various protocols for downloading data packets from the programmer station 2 can be used. The telephone 10 interleaves its requests for data packets from the flash code stream with its requests for data packets from the E²ROM data stream. For instance, a data packet or series of data packets from the flash code stream can be downloaded, followed by a data packet or series of data packets from the E²ROM data stream. In another embodiment, the programmer station 2 can periodically download packets from the two streams of information at various intervals without being prompted to do so by the telephone 10. In any event, the downloading of data from the programmer station 2 to the telephone 10 is fast compared to the actual flash and E²ROM programming. Thus the downloading can be performed during idle times in the flash and/or E²ROM programming without delaying the programming.

Upon receiving portions of the flash code and E²ROM data stream in the SRAM 22, the telephone 10 begins programming the E²ROM 12 and flash memory 14 under the direction of the CPU 24 executing the interleaving program stored in the SRAM 22. More specifically, the processor 24 interleaves the programming of memory 12 with the programming of memory 14. The specific interleaving algorithm will depend on the characteristics of the memories 12 and 14. A first interleaving algorithm (illustrated in FIGS. 2 and 3) interleaves information for receipt by a page-write E²ROM with a page-write flash memory. A second interleaving algorithm (illustrated in FIGS. 4 and 5) interleaves information for receipt by a page-write E²ROM with a byte-write flash memory.

Figure 2:
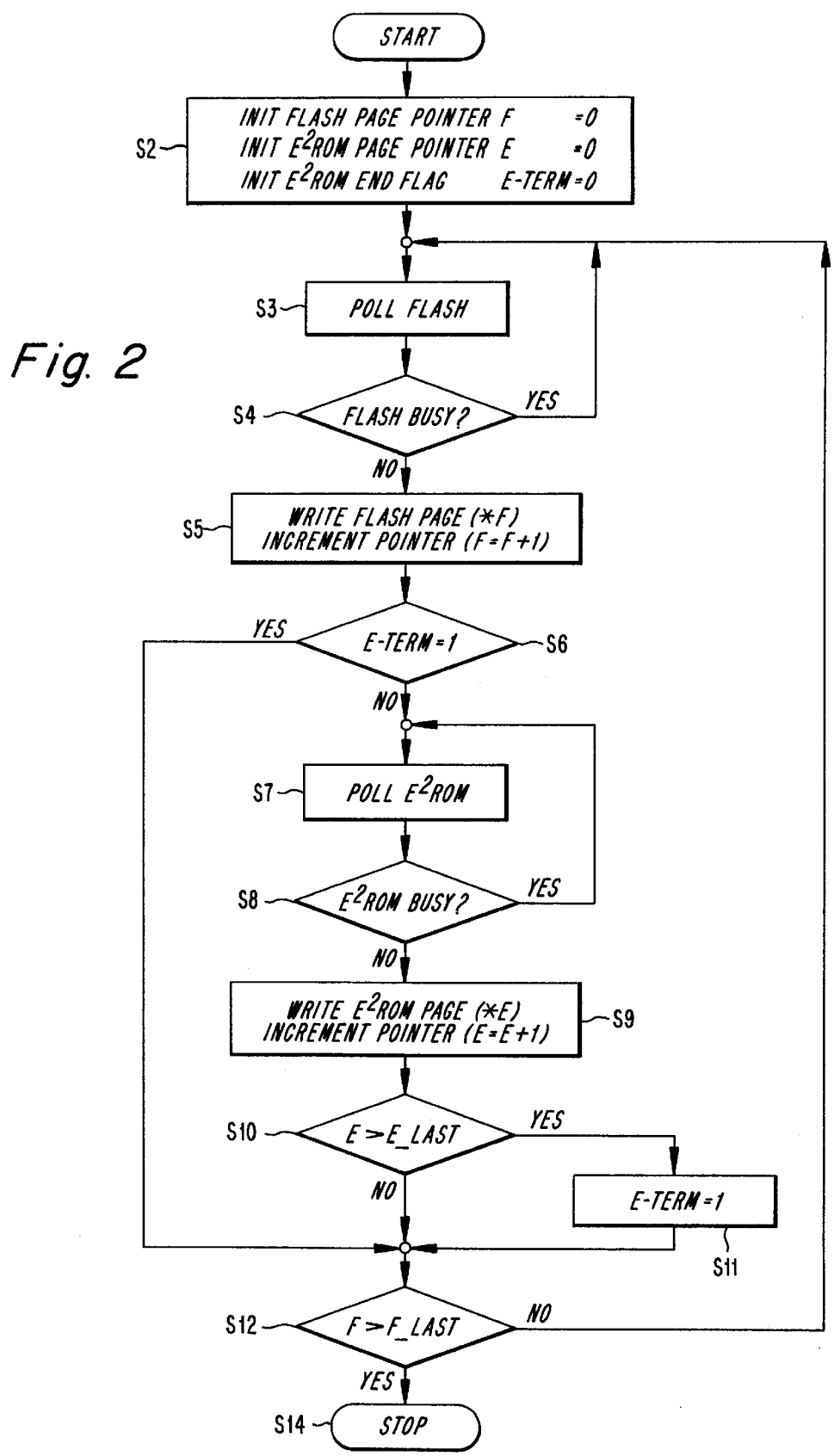
FIG. 2 shows an exemplary flowchart for interleaving page write E²ROM programming with page write flash programming.

Beginning with FIG. 2, assume for the purpose of this discussion that the flash memory programming cycle takes longer than the E²ROM programming cycle. Further assume that the flash memory typically has a larger storage capacity than the E²ROM. For these reasons, in this exemplary embodiment, the algorithm entails performing an E²ROM programming cycle during the period in which the flash memory is programming its memory array.

More specifically, the algorithm starts with a step of initializing a flash page pointer (F), a E²ROM page pointer (E) and an E²ROM end flag (E-TERM) to zero (in step S2). The page pointers point to memory locations at which data is to be stored within the respective semiconductor memory devices. The E²ROM end flag is asserted when a last memory location of the E²ROM has been programmed. As will be discussed, the E-TERM flag is necessary because, in this specific embodiment, there are more flash pages than E²ROM pages. After all E²ROM pages are programmed, interleaving ends and the flash programming proceeds in a conventional manner.

In step S3 the processor 24 polls the flash memory 14. If the flash 14 is not busy (as ascertained in step S4), the processor writes a page of data to flash memory 14 at the location designated by flash pointer (F), and increments the flash pointer (in step S5). If the flash memory 14 is busy, indicating that it is currently programming previously loaded data, the algorithm re-polls the flash memory 14 until the flash indicates that it is ready to receive more data.

Following the downloading of information to the internal buffer of the flash memory 14, the processor 24 attempts to download information to the E²ROM 12. More specifically, the processor 24 first determines whether the E-TERM flag is set to 1, indicating that the E²ROM 12 has been completely programmed (in step S6). If not, the processor 24 will interrogate the E²ROM 12 to determine if it is busy (indicating that it is currently programming information in its internal buffer received in a previous download cycle) (in step S8). If the E²ROM 12 is not busy, the processor 24 downloads a page of data to the E²ROM 12 at the memory location designated by the E pointer, and then increments the E pointer (in step S9). After the write step S9, if the last page the E²ROM 12 has been programmed (as ascertained in step S10) the processor 24 sets the E-TERM flag to 1 (in step S11).

When the E-TERM flag is set to 1, the processor subsequently skips steps S7 to S11, and in the process, programs the remainder of the flash memory 14. More specifically, the processor will cycle through steps S3 to S6 until the F pointer indicates that the flash memory 14 has been completely programmed (as ascertained in step S12). As mentioned, the flash memory 14 typically includes greater storage capacity than the E²ROM 12, and thus it is unlikely that the programming of the flash memory 14 will be completed before the programming of the E²ROM 12. If the E²ROM has more pages than the flash, the roles of the E and F pointers are reversed; otherwise the algorithm is identical.

Figure 3:
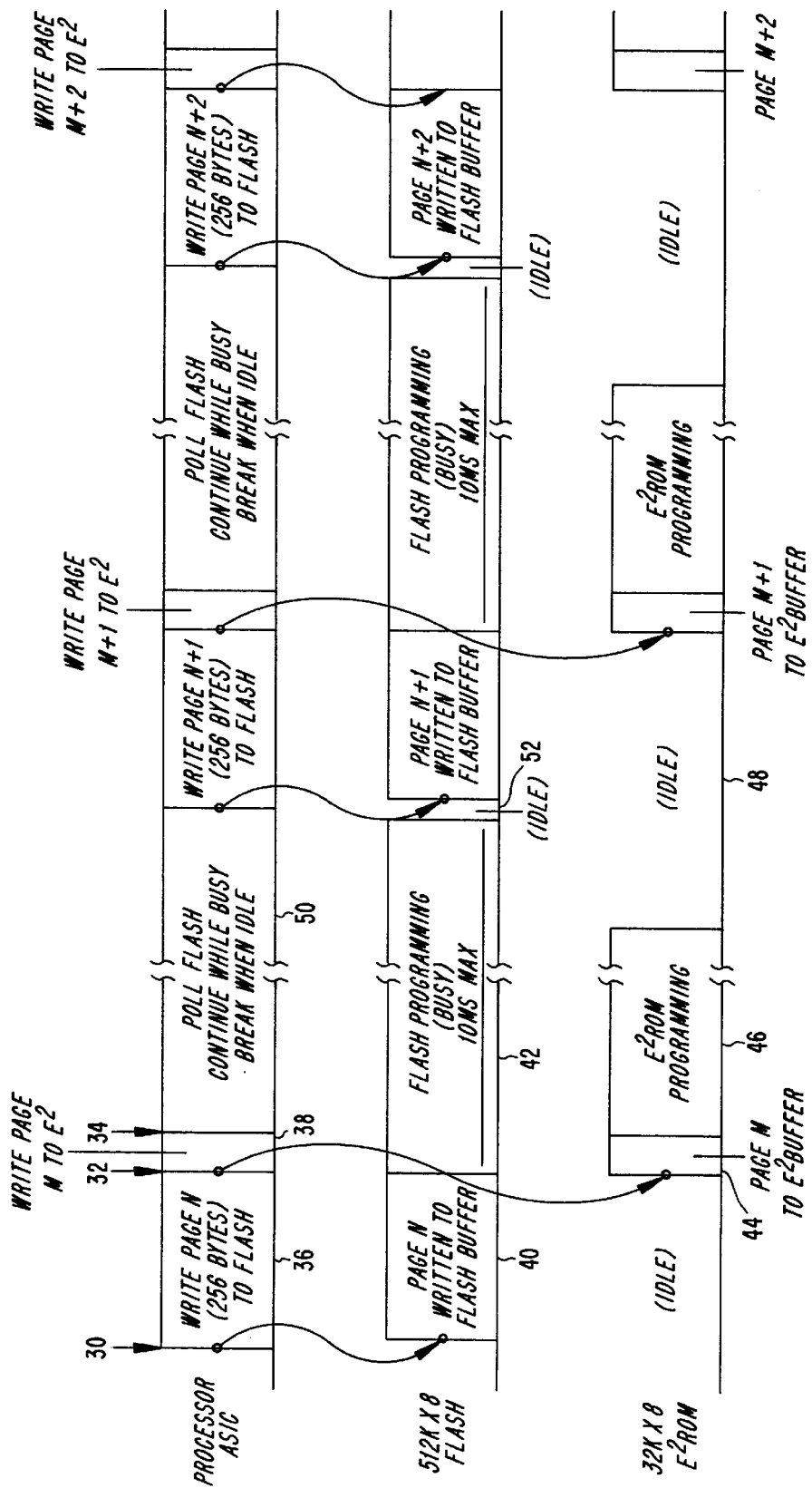
FIG. 3 shows an exemplary timing diagram corresponding to the flowchart of FIG. 2.

FIG. 3 is a timing diagram showing how a page of flash programming is interleaved with a page of E²ROM programming. At time 30, the processor polls the flash memory 12 to determine whether it is busy. If not busy, the processor downloads data to the flash buffer in time interval 36. The flash buffer stores this information in overlapping time interval 40. Thereafter, the flash memory 12 programs the information from its internal buffer to its memory array in time interval 42. Simultaneously therewith, the processor polls the E²ROM starting at point 32 to determine whether the E²ROM is busy. If not busy, the processor downloads data to the E²ROM 12 in interval 38. This information is received by the internal buffer of E²ROM 12 in overlapping time interval 44. The E²ROM 12 then begins programming the information from its buffer to its internal memory array in time interval 46. Note that time intervals 44 and 46 are entirely encompassed within the programming interval 42 of the flash programming cycle. In this manner, the present invention makes use of otherwise idle processor time.

Simultaneously with the concurrent flash and E²ROM programming (in intervals 42 and 46), the processor polls the flash memory in interval 50. The polling starts at time 34 and continues until the processor detects that the flash has finished its programming in interval 42, and has entered an idle state (in interval 52). Since the flash programming takes longer than the E²ROM programming in this specific embodiment, the E²ROM 12 will likewise have finished programming and entered its idle state (in interval 48). At this point, the processor repeats the above series of steps, thereby downloading a second page of flash and E²ROM data.

As shown in FIG. 3, a 512K×8 flash memory may be used (such as the Atmel AT29C040A flash memory), and a 32K×8 E²ROM may be used (such as the Atmel AT28HC256). In this specific example, the flash memory has 2048 pages, whereas the E²ROM has only 512 pages. In view of this difference in capacity, the algorithm of FIG. 2 may be modified such that 2 pages of flash are programmed for every one page of E²ROM, or four pages of flash are programmed for every one page of E²ROM, and the same savings in total program time will be achieved.

Figure 4:
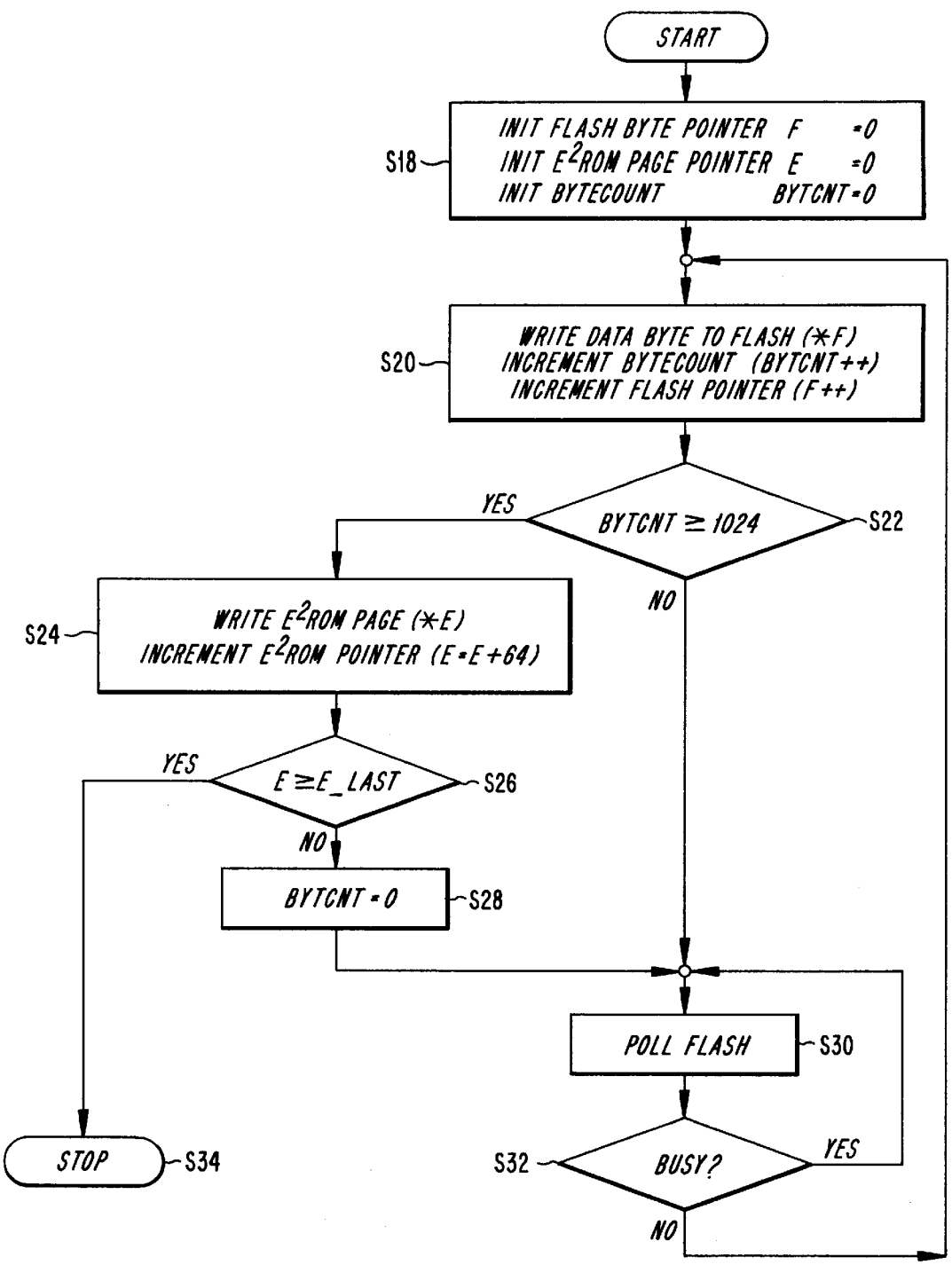
FIG. 4 shows an exemplary flowchart for interleaving page write E²ROM programming with byte write flash programming.

As mentioned, flash memory may require byte-write storage, rather than page-write storage. In this case, a second algorithm is employed. As shown in FIG. 4, the process begins in step S18 by initializing a flash byte pointer (F), an E²ROM page pointer (E) and a byte count (BYTCNT) pointer all to zero. The flash byte pointer points to the current byte location of flash memory 12 in which data is to be stored. The E²ROM page pointer points to the current page location of E²ROM 14 in which data is to be stored. The processor downloads data to the flash memory 12 in series of consecutive 1024 bytes, forming a pseudo-page. The byte counter provides an index of the byte count within the pseudo-page.

Following the initialization of pointers, the processor writes a data byte to flash memory 14, and then increments the flash byte counter (F) and the byte counter (BYTCNT) (in step S22). Thereafter, the processor checks whether 1024 consecutive bytes have been downloaded in series to the flash memory 14 (in step S22). If not, the processor will poll the flash 14 (in step S30) to determine whether it has finished programming the previous data downloaded to the flash buffer (as ascertained in step S32). If the flash memory indicates that it is not busy, the processor will successively download more bytes of data to the flash buffer until the point where 1024 bytes have been downloaded to the flash 14.

When 1024 bytes have been downloaded, the processor writes a page of data to the E²ROM (in step S24). The processor then checks to see if this written page was the last page of E²ROM memory (in step S28). If so, the algorithm stops (in step S34). If this was not the last page, the byte count is reset to zero (in step S28) and the algorithm proceeds to successively write another series of 1024 bytes to the flash memory.

It will be evident that the allocation of 1024 bytes of flash data to one page of E²ROM data is exemplary, and dependent on the specific memory capacity of the semiconductor memory device employed. In the specific embodiment presented, the set of consecutive byte writes to flash memory (in this case 1024) forms a pseudo-page of data. The number of cycles of byte writes may be chosen such that the number of pages in E²ROM matches the number of pseudo-pages. This is why, in step S26, if the last page of E²ROM is encountered, the programming of the flash memory 14 will have likewise have been completed, and the process can terminate in step S34.

Figure 5:
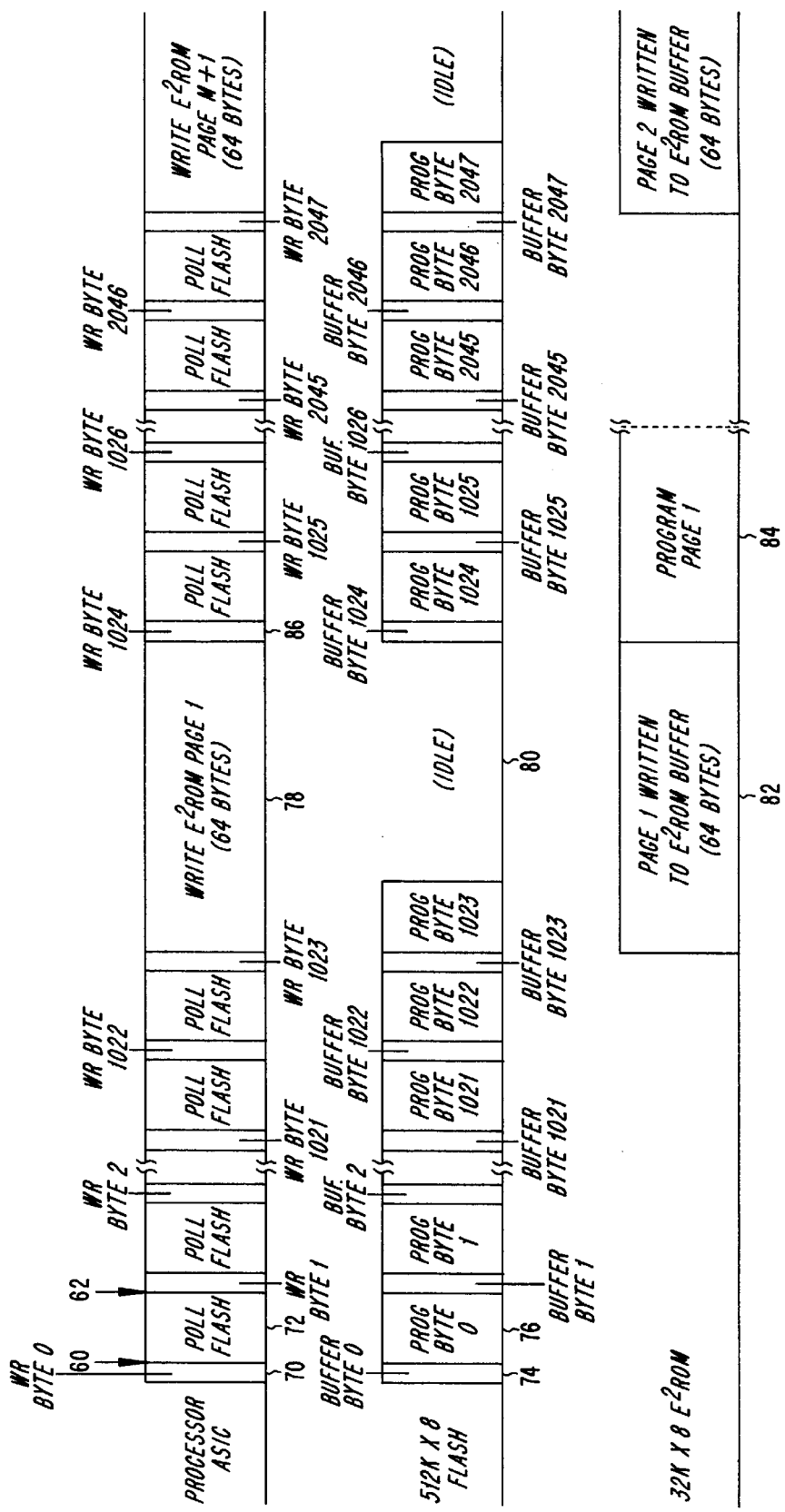
FIG. 5 shows an exemplary timing diagram corresponding to the flowchart of FIG. 4.

FIG. 5 shows a timing diagram corresponding to the algorithm set forth in FIG. 4. In time interval 70 the processor downloads a first byte (byte 0) to flash memory 14. The flash memory 14 receives this information in its internal buffer in time interval 74, and then proceeds to transfer this information to its memory array in time interval 76. Immediately after transferring this first byte (byte 0) to the flash memory 14, the processor commences (at point 60) to poll the flash memory to determine whether it has finished programming, which continues throughout time interval 72 until the flash memory 14 indicates that it has finished programming. Immediately thereafter, the processor repeats the above described cycle. In fact, this cycle is repeated as many times as necessary to complete a pseudo-page of flash memory. In the specific embodiment shown in FIG. 5, a pseudo-page corresponds to 1024 bytes.

After the last byte of the flash pseudo-page has been transferred to the flash memory buffer, the processor downloads a page of data (e.g. comprising 64 bytes) to E²ROM memory 12 in interval 78. The E²ROM 12 receives the page of data in time interval 82, and thereafter transfers this information from its internal buffer to its memory array in time interval 84. Immediately after the processor has downloaded a page of data to the E²ROM 12 in interval 78, it commences downloading another pseudo-page (i.e. series of 1024 bytes) into flash memory 14, starting with byte 1024 in time interval 86. Note that the programming of the second pseudo-page of flash memory is performed concurrently with the programming of the first page of E²ROM memory in interval 84. The above process is repeated until the last pseudo-page of flash and the last page of E²ROM are encountered.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

For example, the specification discusses the use of E²ROM and flash memory for cellular phones. Yet the principles disclosed are not restricted to this specific application. Furthermore, the above discussion is framed in the context of interleaving E²ROM and flash memory having certain exemplary operating characteristics and storage capacities. Yet it will be apparent to those skilled in the art that the principles disclosed can be applied to any pair (or plurality) of semiconductor memories regardless of operating characteristic or storage capacity. Finally, the principles disclosed above may be applied in the instance where one or more of the semiconductor memories is initialized to zeros (00H).

What is claimed is:

1. A method for writing a first stream of information to a first semiconductor memory device and writing a second stream of information to a second semiconductor memory device, comprising steps of:

writing a portion of said first stream of information to said first memory device;

storing said portion of said first stream within a buffer of said first memory device;

transferring, in a first transferring step, said portion of said first stream from said buffer to a memory array of said first memory device;

concurrently with said first transferring step:
    writing a portion of said second stream of information to said second memory device;
    storing said portion of said second stream within a buffer of said second memory device; and
    transferring, in a second transferring step, said portion of said second stream from said buffer of said second memory device to a memory array of said second memory device;

wherein writing to said first memory device is always performed at different times than writing to said second memory device;

wherein said first and second streams of information comprise separate first and second binary files, respectively.

2. The method of claim 1, wherein said first semiconductor memory device comprises a flash memory device.

3. The method of claim 2, wherein said second semiconductor memory device comprises an EEPROM memory device.

4. The method of claim 3, wherein said flash memory device accepts said first data stream in portions of pages, and said EEPROM memory device accepts said second stream in portions of pages.

5. A method for writing a first stream of information to a first semiconductor memory device and writing a second stream of information to a second semiconductor memory device, comprising steps of:

writing, in a first writing step, a portion of said first stream of information to said first memory device;

storing, in a first storing step, said portion of said first stream within a buffer of said first memory device;

transferring, in a first transferring step, said portion of said first stream from said buffer to a memory array of said first memory device;

concurrently with said first transferring step:
    writing, in a second writing step, a portion of said second stream of information to said second memory device;
    storing, in a second storing step, said portion of said second stream of information in a buffer of said second memory device; and
    transferring, in a second transferring step, said portion of said second stream from said buffer of said second memory device to a memory array of said second memory device;

repeating said second writing, storing and transferring steps a plurality of times to download an aggregate portion of said second stream of information to said second memory device;

wherein writing to said first memory device is always performed at different times than writing to said second memory device;

wherein said first and second streams of information comprise separate first and second binary files, respectively.

6. The method of claim 5, wherein said first semiconductor memory device comprises an EEPROM memory device.

7. The method of claim 6, wherein said second semiconductor memory device comprises a flash memory device.

8. The method of claim 7, wherein said flash memory device accepts said second data stream in portions of bytes, and wherein said aggregate portion forms a pseudo-page, and said EEPROM memory device accepts said first stream in portions of pages.

9. A system for writing a first stream of information to a first semiconductor memory device and writing a second stream of information to a second semiconductor memory device, comprising:

a processor for writing a portion of said first data stream to said first memory device, and for writing a portion of said second data stream to said second memory device;

a first buffer in said first memory device for storing said portion of said first stream;

a second buffer in said second memory device for storing said portion of said second data stream;

first logic for transferring said portion of said first stream from said first buffer to a memory array of said first memory device;

second logic for transferring said portion of said second stream from said second buffer of said second memory device to a memory array of said second memory device;

wherein said first logic performs its transferring concurrently with said second logic performing its transferring;

wherein writing to said first memory device is always performed at different times than writing to said second memory device;

wherein said first and second streams of information comprise separate first and second binary files, respectively.

10. The system of claim 9, wherein said first semiconductor memory device comprises a flash memory device.

11. The system claim 10, wherein said second semiconductor memory device comprises an EEPROM memory device.

12. The system of claim 11, wherein said flash memory device accepts said first data stream in portions of pages, and said EEPROM memory device accepts said second stream in portions of pages.

13. A system for writing a first stream of information to a first semiconductor memory device and writing a second stream of information to a second semiconductor memory device, comprising:

a processor for writing a portion of said first data stream to said first memory device, and for writing a portion of said second data stream to said second memory device;

a first buffer in said first memory device for storing said portion of said first stream;

a second buffer in said second memory device for storing said portion of said second data stream;

first logic for transferring said portion of said first stream from said first buffer to a memory array of said first memory device;

second logic for transferring said portion of said second stream from said second buffer of said second memory device to a memory array of said second memory device;

wherein said processor includes interleaving logic for writing a plurality of said portions of said second data stream to said second memory device while said first logic is transferring said portion of said first stream from said first buffer to said memory array of said first memory device, wherein said plurality of portions forms an aggregate portion;

wherein writing to said first memory device is always performed at different times than writing to said second memory device;

wherein said first and second streams of information comprise separate first and second binary files, respectively.

14. The system of claim 13, wherein said first semiconductor memory device comprises an EEPROM memory device.

15. The system of claim 14, wherein said second semiconductor memory device comprises a flash memory device.

16. The system of claim 15, wherein said flash memory device accepts said second data stream in portions of bytes, and wherein said aggregate portion forms a pseudo-page, and said EEPROM memory device accepts said first stream in portions of pages.

* * * * *